(12) United States Patent
Efimov

(10) Patent No.: US 8,792,099 B1
(45) Date of Patent: Jul. 29, 2014

(54) METHOD AND APPARATUS FOR PHASE DETECTION IN A BEAM STEERING LASER ARRAY

(75) Inventor: Oleg M. Efimov, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 393 days.

(21) Appl. No.: 13/332,939

(22) Filed: Dec. 21, 2011

(51) Int. Cl.
*G01B 9/02* (2006.01)

(52) U.S. Cl.
USPC .......................................................... 356/450

(58) Field of Classification Search
USPC .......................................................... 356/450
See application file for complete search history.

(56) References Cited

U.S. PATENT DOCUMENTS

| | | | | |
|---|---|---|---|---|
| 5,071,251 | A | * | 12/1991 | Hochberg et al. ............. 356/513 |
| 6,219,187 | B1 | * | 4/2001 | Hwu et al. .................... 359/627 |
| 7,499,174 | B2 | * | 3/2009 | Farah ............................ 356/450 |
| 2011/0235049 | A1 | * | 9/2011 | Burnett et al. ................ 356/484 |

OTHER PUBLICATIONS

T.Y. Fan, "Laser Beam Combining for High-Power, High-Radiance Sources", *IEEE J. of Selected Topics in Quan. Elect.*, vol. 11, No. 3, May/Jun. 2005.
Kenneth Li, "Etendue efficient coupling of light using dual paraboloid reflectors for projection displays," *Proc. of SPIE*, 4657, 1 (2002).
T. R. O'Meara, "The multidither principle in adaptive optics," *J. Opt. Soc. Am.* 67, 306, (1977).
T. R. O'Meara, "Stability of an N-loop ensemble-reference phase control system," *J. Opt. Soc. Am.* 67, 315, (1977).
S. D. Lau, J. P. Donnelly, C. A. Wang, R. B. Goodman, and R. H. Rediker, "Optical phase difference measurement and correction using AlGaAs integrated guided-wave components," *IEEE Photon. Technol. Lett.*, 3, 902, (1991).
B. Golubovic, J. P. Donnelly, C. A. Wang, W. D. Goodhue, R. H. Rediker, "Basic module for an integrated optical phase difference measurement and correction system," *IEEE Photon. Technol. Lett.*, 7,649, (1995).
L. Liu, et al., "Phase-Locking of Tiled Fiber Array using SPGD Feedback Controller", Proc. SPIE 5895-5895OP-1(2005).

\* cited by examiner

*Primary Examiner* — Tarifur Chowdhury
*Assistant Examiner* — Jonathon Cook
(74) *Attorney, Agent, or Firm* — Ladas & Parry

(57) ABSTRACT

A method and apparatus for measurement of individual phases of beams from a beam steering laser array relative to a reference laser beam. The disclosed method and apparatus is based on the use of a partially reflecting ellipsoidal reflector or dual paraboloidal reflector having two focal areas to make an image of the laser array located in one of the focal areas appear at the other focal area. Illumination of this image with a phase modulated beam from a reference laser coherent with the laser array allows the application of dithering techniques to measure individual phases of beams from array. Any laser beam in the array or a separate laser coherent with the laser array can be used as a reference beam. In addition, the partially reflecting ellipsoidal reflector or dual paraboloidal reflector can provide protection for the beam steering laser array from environmental impacts or damage.

18 Claims, 5 Drawing Sheets

Surface of laser array 10

Lasers 20 in laser array 10 disposed in some selected array pattern

METHOD AND APPARATUS FOR PHASE DETECTION IN A BEAM STEERING LASER ARRAY

STATEMENT REGARDING FEDERALLY SPONSORED RESEARCH OR DEVELOPMENT

The present invention was made with support from the United States Government under contract number HR011-10-C-150 awarded by the Defense Advanced Research Projects Agency (DARPA). The United States Government has certain rights in the invention.

CROSS REFERENCE TO RELATED APPLICATIONS

None.

TECHNICAL FIELD

This invention relates a method and apparatus for detection of individual phases of beams from beam steering laser array relative to a reference laser beam.

BACKGROUND

There are two main approaches for beam steering known in the prior art. The first is to use a single beam propagating in some predetermined direction and then this "ready to use" beam is steered with a movable reflector such as a mirror. Any optical beam can be used as such a single beam, but a more powerful beam can be developed by combining of the beams of a laser array as shown in FIG. 1.

In this approach, the final combined beam has a fixed direction before steering; therefore, an array of low-divergent (essentially collimated) beams can be used as shown in FIG. 1 (only three laser beams from array are shown for simplicity of illustration).

The relative phases of the coherent beams are controlled to obtain constructive interference of all the beams in a chosen direction X in FIG. 1 (this is called "coherent beam combining" where all of the combined beams have the same wavelength) or all the beams are combined in the same direction by dichroic mirrors, prisms, gratings, etc. (this is called "spectral beam combining" where the combined beams have different wavelengths). See, for example, T. Y. Fan, "Laser Beam Combining for High-Power, High-Radiance Sources", *IEEE J. of Selected Topics in Quan. Elect.*, Vol. 11, No. 3, May/June 2005. Spectral beam combining does not require phase measurement and control and therefore it is not further discussed here.

Coherent beam combining involves saving of combined beam direction by phase control—or more accurately—by phase locking of all the beams from a laser array which means that these beams have to have fixed phases providing the fixed chosen direction of main interference lobe of combined beam. In this case, the steering of this lobe or beam steering is accomplished by a movable reflector such as a mirror shown in FIG. 1. To implement this method, small portion of the beam intensities is usually taken by plane beam sampler (FIG. 1) for beam phase locking by a dithering technique (see, T. R. O'Meara, "The multidither principle in adaptive optics," *J. Opt. Soc. Am.* 67, 306, 1977) or by stochastic parallel gradient descent feedback technique (see, L. Liu, M. A. Vorontsov. "Phase-locking of tiled fiber array using SPGD feedback controller," *Proc. SPIE*, 5895, 58950P-1, 2005). These techniques provide for development of far field image of interfering beams (usually by lenses), measurements of beam intensities at dithering frequencies or combined beam intensity depending on technique, and beam phase controls through feedbacks. Since the combined beam has to be developed in a fixed direction X, the sampled portion of beam has fixed direction also (FIG. 1). This portion can be taken with a low-reflecting beam sampler or even as a reflection from some bright spot on a target (see the T. R. O'Meara article). However, the described method of beam steering with movable reflectors does not allow agile beam steering because it requires motion.

To overcome this obstacle, another approach shown in FIGS. 2a and 2b, can be used (again, only three laser beams from array are shown for simplicity). In this case, an array of rather wide-divergent beams is used and beam steering is accomplished by constructive interference of multiple coherent laser beams as a main lobe in a desired direction. This can be done through the proper modification of beam phases and involves beam phase measurements, calculations of phase relations between the beams for required constructive interference of the main lobe direction, and control of beam phases through feedback.

Actually, the angles of beam divergences $\theta$ will define the maximum angle of beam steering which is $\sim\pm\theta/2$). If all the beams from the laser array have the same phase, the main interference lobe of a randomly positioned laser array is directed normal to the surface of the array output as shown in FIG. 2a. In the case of orderly positioned beams, the intensities of sidelobes may have intensities comparable with the intensity of main lobe; therefore, such a design is not really practical. To direct the main lobe of the combined beam in some selected direction (see FIG. 2b), it is necessary to calculate and apply proper phase shifts between all the beams of the laser array. Such phase shifts will develop a powerful beam in one selected direction (the main lobe) with multiple, suitably low-intensity sidelobes in other directions, which sidelobes look like much like noise. More beams positioned closer to each other in the laser array will provide a higher intensity of the combined beam (the main lobe) relative to the noise-like sidelobes. The advantage of this technique is that it is not necessary to move or reflect mechanically any of the beams of the laser array for beam steering; they have absolutely stable positions in space. Electronic control of the phases, which can be implemented for quick action, is required for beam steering in the apparatus of FIG. 2b. So this electronic phase control technique provides faster beam steering than the mechanical approach of FIG. 1.

For phase measurements, the spatially stable sample of beam interaction area (or even some reflection from a bright spot on a target—see the T. R. O'Meara article mentioned above—can be used; however, this sample has to be fixed in the space for measurements, which is not possible in the case of a steering beam) or image of laser array output has to be formed. Prior art optical systems consisting of a plane beam sampler and imaging optics used for collimated beam combining as shown in FIG. 1. For beam steering approach shown in FIG. 2a, such systems start being rather cumbersome for large angles of steering and require the application of special high numerical aperture optics as shown in FIG. 2a. Simple geometrical considerations show that in the cases of steering angles close to $\pm 45°$ or larger, sampling every single beam from the laser array as a whole cannot be taken by a plane sampler because of the very large beam divergence, which should be close to 90° or larger. Thus, if the steering angle is close to or more than $\pm 45°$, the optical systems consisting of plane reflectors/samplers and standard optics cannot be used to take a sample of the beam array as a whole to make its stable image.

The present disclosure describes a new design of a relatively compact imaging system which can be applied for very large angles of steering close to ±90° and provides stable spatial positions of beam output images. Simultaneously, the disclosed systems can provide a protective cover for laser array to help protect against environmental impacts.

The prior art also includes:

Kenneth Li, "Etendue efficient coupling of light using dual paraboloid reflectors for projection displays," *Proc. of SPIE*, 4657, 1 (2002).

T. R. O'Meara, "The multidither principle in adaptive optics," *J. Opt. Soc. Am.* 67, 306, (1977).

T. R. O'Meara, "Stability of an N-loop ensemble-reference phase control system," *J. Opt. Soc. Am.* 67, 315, (1977).

L. Liu, D. N. Loizos, P. P. Sotiriadis, and M. A. Vorontsov, "Coherent combining of multiple beams with multidithering technique: 100 kHz closed-loop compensation demonstration," *Proc. of SPIE*, 6708, 67080D-1, (2007).

S. D. Lau, J. P. Donnelly, C. A. Wang, R. B. Goodman, and R. H. Rediker, "Optical phase difference measurement and correction using AlGaAs integrated guided-wave components," *IEEE Photon. Technol. Lett.*, 3, 902, (1991).

B. Golubovic, J. P. Donnelly, C. A. Wang, W. D. Goodhue, R. H. Rediker, "Basic module for an integrated optical phase difference measurement and correction system," *IEEE Photon. Technol. Lett.*, 7, 649, (1995).

BRIEF DESCRIPTION OF THE INVENTION

In one aspect this invention relates to a method and apparatus for measurement of individual phases of beams from a coherent beam steering laser array (an array of laser beams each having a common wavelength) relative to a reference laser beam. It is based on the use of a partially reflecting ellipsoidal reflector or dual paraboloidal reflector having two focal areas to make an image of the laser array located in one of the focal areas appear at the other focal area. Illumination of this image with a phase modulated beam from a reference laser coherent with the laser array allows the application of dithering techniques to measure individual phases of beams from array. Any laser beam from the array or another laser coherent with the laser array can be used as a reference beam. In addition, the partially reflecting ellipsoidal reflector or dual paraboloidal reflector can provide protection for the beam steering laser array from environmental impacts or damage.

In another aspect this invention relates to a method for collecting optical information for measurement of individual phases of beams from a laser array, the method comprising: placing the laser array at a first focal area of a partially reflecting ellipsoidal or dual paraboloidal reflector to thereby image the laser array at a second focal area of the partially reflecting ellipsoidal or dual paraboloidal reflector; illuminating the image of the laser array at the second focal area with a phase modulated beam from another laser coherent with the laser array; disposing a photodiode array ordered in accordance with the image of the laser array outputs at the second focal area; and detecting the signals from the photodiode array and determining phase differences between beams from the laser array and from the reference beam.

DETAILED DESCRIPTION

Figure 3A:
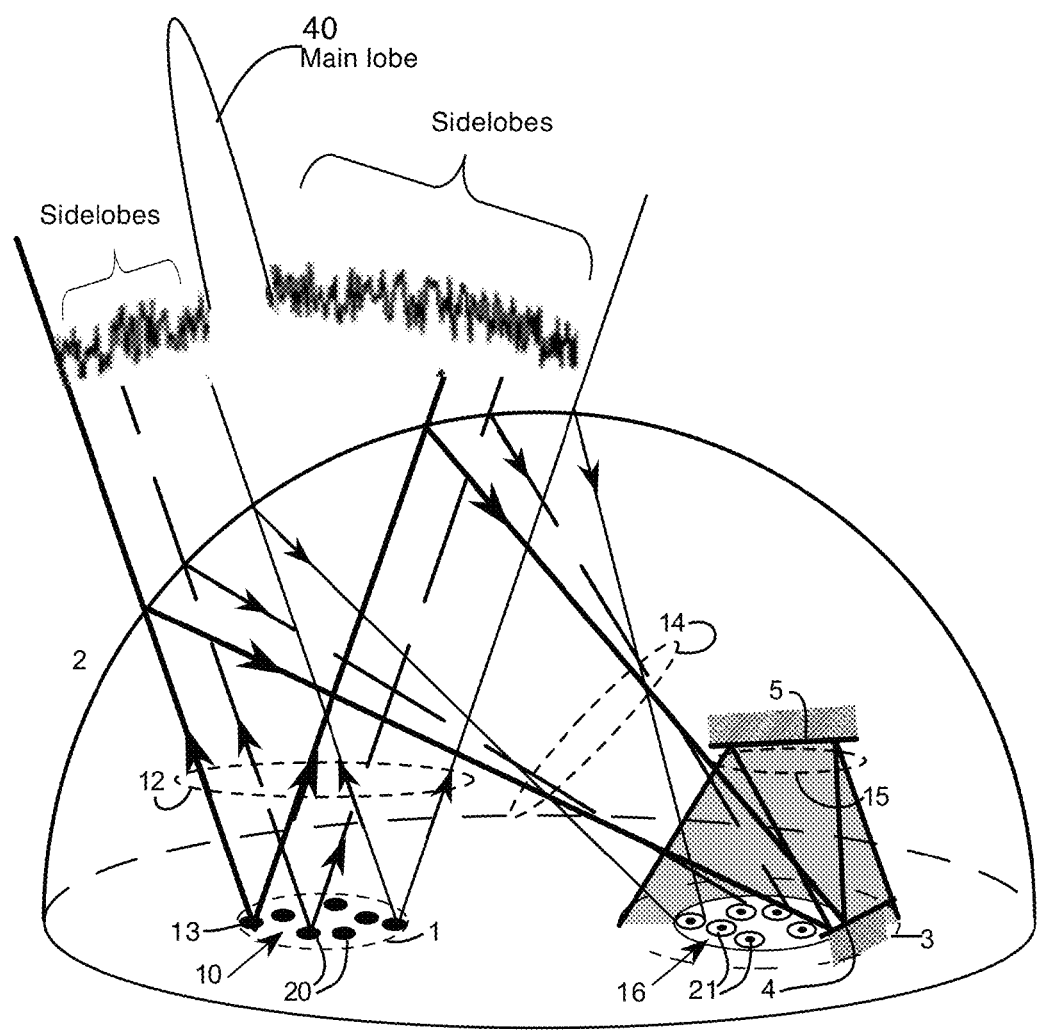
FIGS. 3a and 3b present examples of imaging systems with an ellipsoidal reflector (FIG. 3a) and a dual paraboloidal reflector consisting of two paraboloids properly aligned relative to each other (FIG. 3b).
Figure 3B:
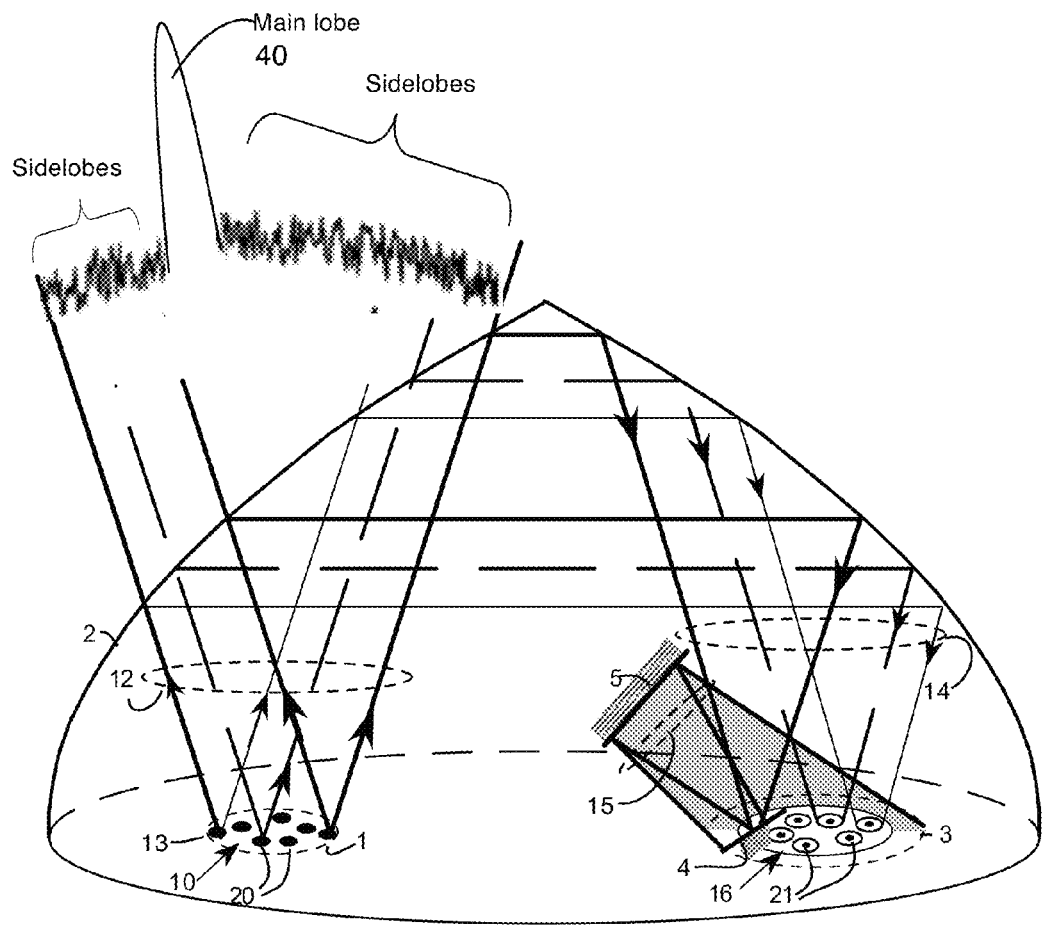

A method and apparatus for detection of the individual phases of optical beams from a coherent laser array 10 located at a first focal area 1 relative to a reference laser beam 15 (from a reference laser 13) shown in bold solid lines in FIGS. 3a and 3b. FIGS. 3a and 3b present embodiments of imaging systems with an ellipsoidal reflector 2 (FIG. 3a) and a dual paraboloidal reflector 2 consisting of two paraboloids properly aligned relative to each other (FIG. 3b). After reflections from mirrors 4 and 5, the reference beam 15 illuminates images of all the other beams inside the region 16 (which region 16 contains an array of photodetectors 21) at the second focal area 3 for interference with them. A partially reflecting ellipsoidal reflector 2 (see FIG. 3a) or dual paraboloidal reflector 2 (see FIG. 3b) having two focal areas 1, 3 is utilized with a laser array 10 located at one of the two focal areas (the array 10 is located a focal or focus area 1 in FIGS. 3a and 3b, but either focal area 1, 3 could be used). The partially reflecting reflectors 2 are preferably mostly transmissive and only need to reflect only a small portion of the energy emitted by array 10 (only the interior surfaces of the reflectors 2 and reflections from the reflectors 2 are depicted in FIGS. 3a and 3b for simplicity of illustration). So the reflectors 2 are partially reflective mirrors formed in either an ellipsoidal or a dual paraboloid shape. Since the laser array 10 is located at one focal area (focal area 1 in these two figures), an image of the laser array 10 appears at the other focal area (focal area 3 in these two figures). Illumination of this image at a proper angle with a phase modulated beam from the reference laser 13 coherent with the laser array 10 allows application of a dithering technique to measure individual phases of beams from array 10. In addition, the reflectors 2 preferably provide some protection of the beam steering laser array 10 from environmental impacts. The measurements of individual phases of beams from array 10 and following accurate control of these phases through feedbacks allow controllable change in the direction of main interference lobe 40 in FIGS. 3a, b. This lobe is a result of interference of all the beams from laser array 10 transmitted through the reflector 2.

The disclosed apparatus and method can be understood from FIGS. 3a and 3b where a system with the ellipsoidal (FIG. 3a) and the dual paraboloidal (FIG. 3b) partially reflecting reflectors 2 are shown as exemplary embodiments. The beams 12 from the emitting surfaces of laser array 10 placed at the first focal area 1 of reflectors 2 are partially reflected (as beams 14) from reflectors 2 and an image the emitting surfaces of laser array 10 is formed at the second focal area 3.

Figure 4:
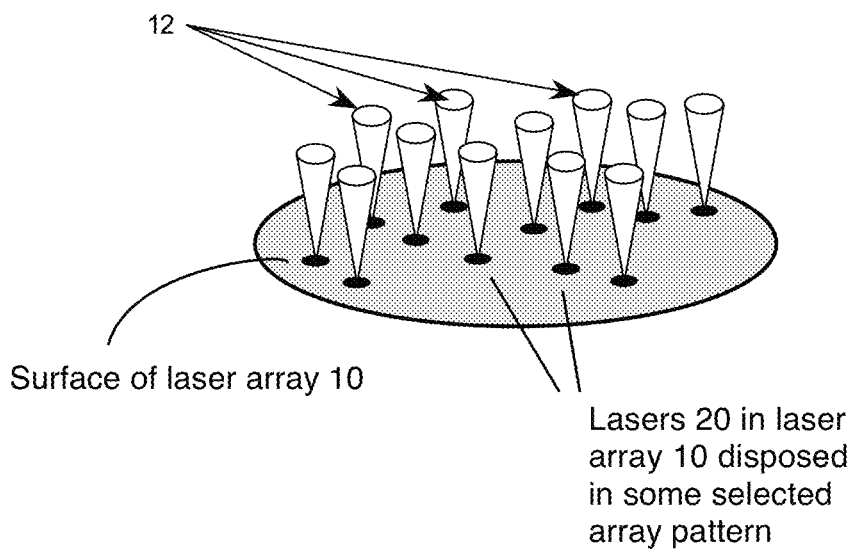
FIG. 4 shows the array of the laser outputs arranged in some selected order, pattern or arrangement.

The array 10 comprises a number of individual coherent lasers 20 arranged in some selected order, pattern or arrangement. FIG. 4 shows an array 10 of such lasers 20 arranged in some selected order, pattern or arrangement. The arrays of photodetectors 21, also preferably set a corresponding order, pattern or arrangement to the lasers 20, are placed at the second focal area 3 to receive reflected optical signals from the corresponding reflected laser beams 14. The reference laser 13 is preferably one of the lasers in array 10.

Mirrors 4 and 5 are used to get light from one of the beams (which is chosen to be a reference beam 15) and interfere it with the other beams. There are many lasers 20 in an array, but FIGS. 3a and 3b are simplified to show only three laser beams from an array 10 of lasers 20. Of course, there are many more such beams (and corresponding lasers 20), but showing the additional beams in these figures would unnecessarily complicate them. One of the beams is reference beam 15 (shown in bold solid lines in FIGS. 3a and 3b) which has to be reflected from mirrors 4 and 5 to interact with the other beams from array 10. Only two beams from the rest of laser outputs are shown in FIGS. 3a and 3b for simplicity of illustration (in thin solid and dashed lines in FIGS. 3a and 3b).

Figure 1:
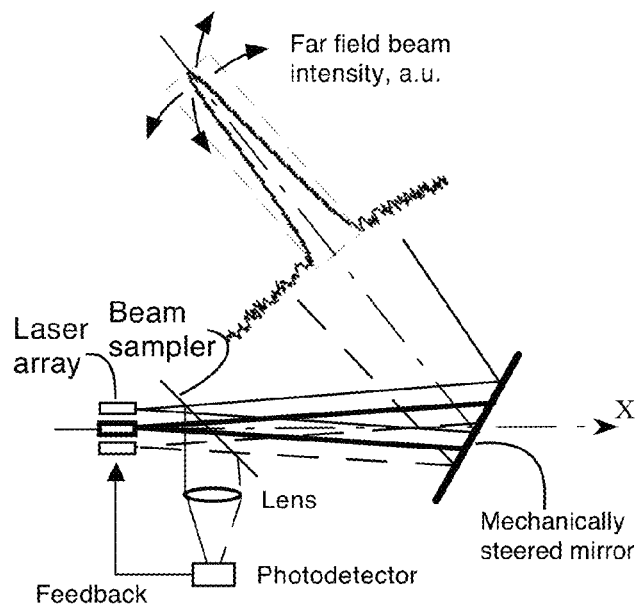
FIG. 1 depicts prior art beam steering technique where the final combined beam has a fixed direction and the actual beam steering is done by a downstream mechanically steered mirror.
Figure 2A:
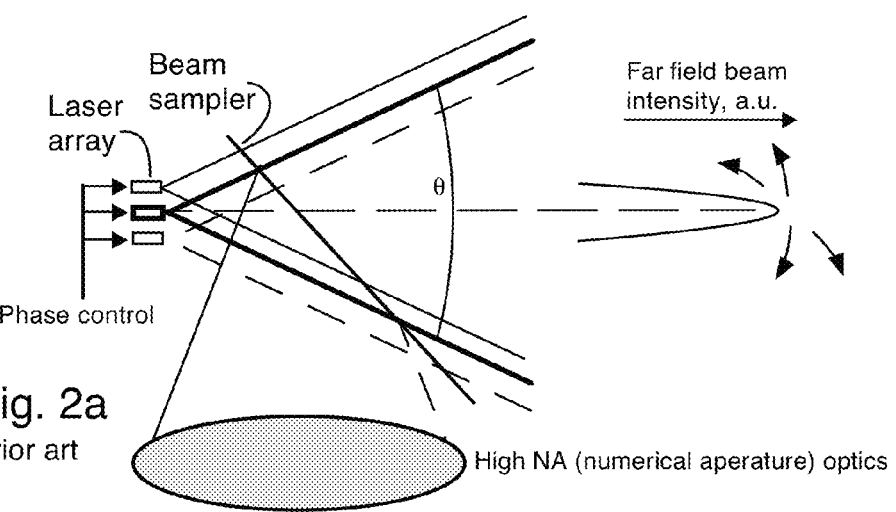
FIGS. 2a and 2b depict prior art beam steering techniques where the final combined beam has a direction dictated by the phases of the individual beams.
Figure 2B:
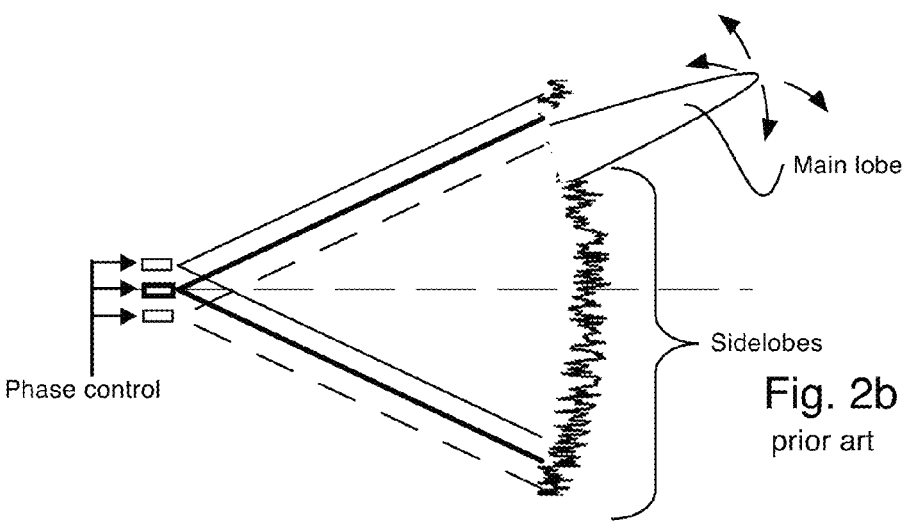

Any beam 12 from laser array 10 can be used as the reference beam 15 and an arbitrary laser 13 is depicted as the reference laser. The reference beam is needed to measure the phases of all the other beams relative to this selected reference beam. Also the beams 12 are depicted for ease of illustration having fairly small divergences but it is to be recalled that these beams 12 each diverge more or less as shown in FIG. 2a with a divergence equal to as much as θ (although the embodiment of FIG. 3a can accommodate a wider beam than can the embodiment of FIG. 3b).

Figure 5:
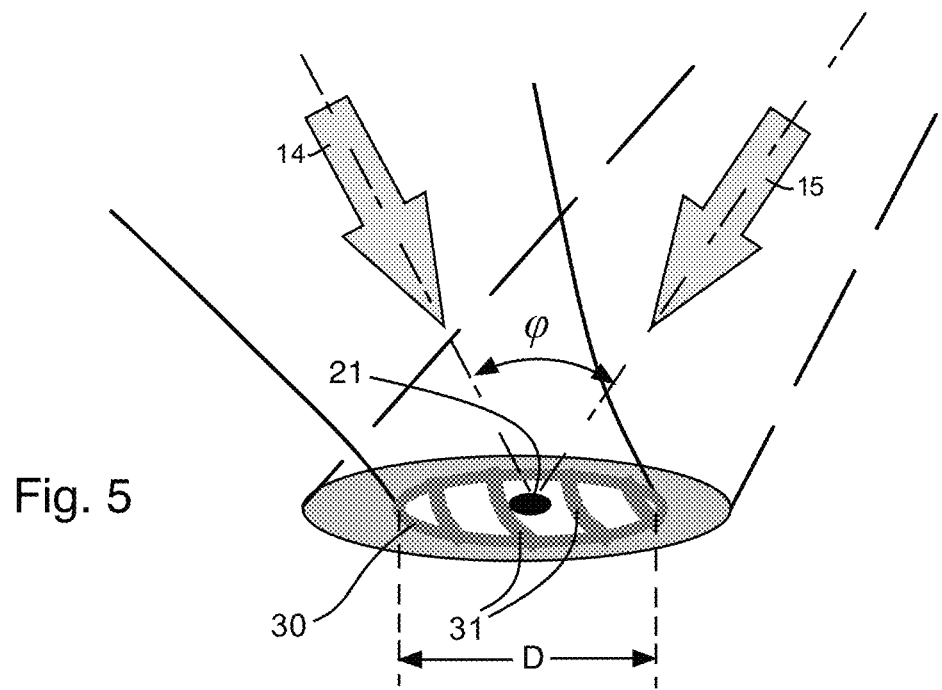
FIG. 5 depicts one of the photodiodes illuminated by both laser output image and reference beam.
Figure 6:
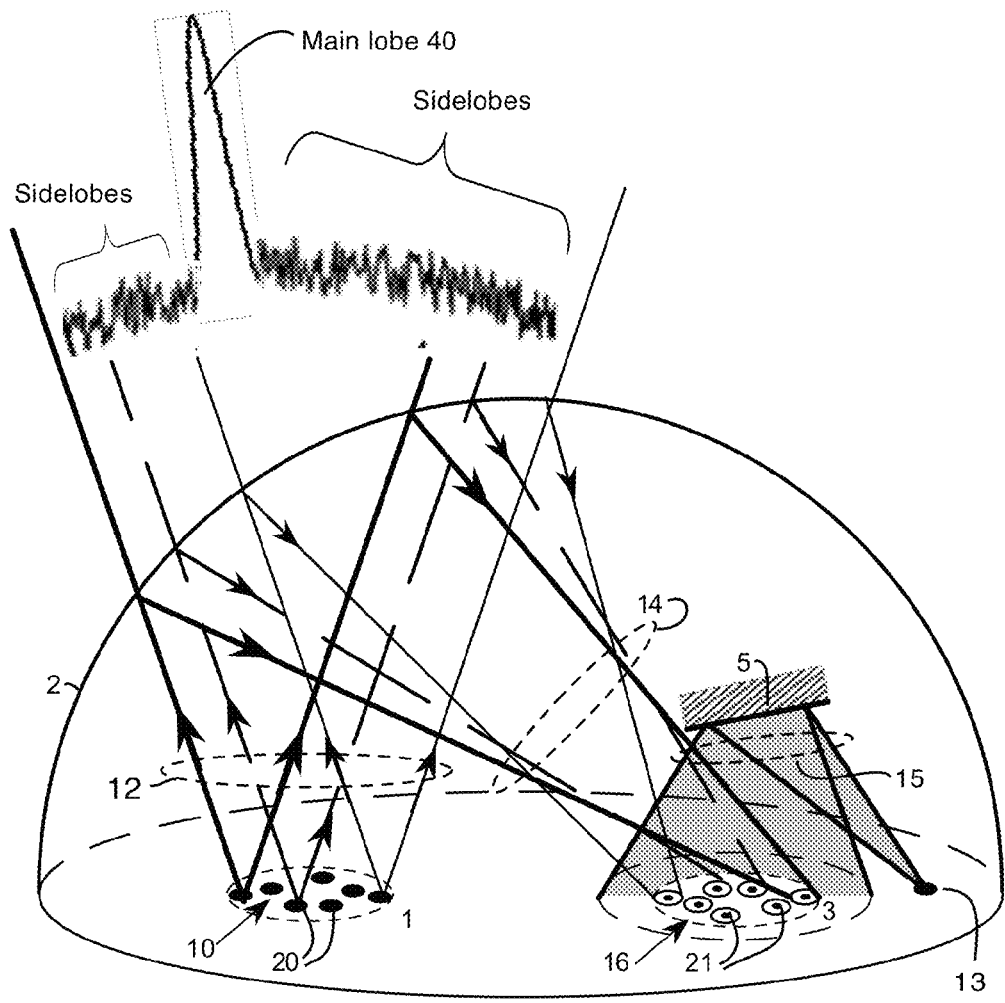
FIG. 6 depicts examples of imaging systems with ellipsoidal reflector and reference beam separated from the laser array.

FIG. 5 shows an individual photodetector 21 from the array of photodetectors 21 in region 16 (see FIGS. 3a and/or 3b) illuminated by both the image 30 of one of the laser beam outputs from laser array 10 (see FIGS. 3a and/or 3b) and a part of the reference laser beam 15. Beam interference results in appearance of interference fringes 31 across the beam image 30. A sinusoidal phase dither $\Gamma \sin \omega t$ (where $\Gamma$ and $\omega$ are the amplitude and frequency of phase dither and t is time) is applied to this selected, reference beam 15. Preferably, a phase modulator (not shown) is used to apply phase dither to the reference beam. This will result in the spatial dither of interference fringes and in amplitude modulated signals from all photodetectors 21. It has been shown (see, e.g., T. R. O'Meara, "The multidither principle in adaptive optics" and S. D. Lau, J. P. Donnelly, C. A. Wang, R. B. Goodman, and R. H. Rediker, "Optical phase difference measurement and correction using AlGaAs integrated guided-wave components", both of which papers are identified above in greater detail and both of which papers are hereby incorporated herein by reference) that the analysis of these signals can be used to calculate the beam phases relative to a reference laser beam. The phase differences between the reference and each non-reference beam can be calculated using:

$$\Delta \phi = \arctan\left(\frac{A(\omega)J_2(\Gamma)}{A(2\omega)J_1(\Gamma)}\right)$$

where $A(\omega)$ and $A(2\omega)$ are the amplitudes of the first and second harmonics of signal from photodetectors 21 and $J_1(\Gamma)$ and $J_2(\Gamma)$ are Bessel functions of the first kind of order one and two, respectively. This calculation is done for each reference beam-non-reference beam photodetector pair. To realize these measurements, the sizes of photodetectors 21 have to be small relative to the images of laser array outputs and the angles between the laser array beams and reference beam have to be arranged to provide a few interference fringes 31 across the image 30 (the angles between the laser array beams and reference beam have to provide at least one interference fringe 31 across the images. It is well known that the period of interference fringes $\Lambda$ depends on the angle $\phi$ between the beams and beam wavelengths $\lambda$ as:

$$\Lambda = \frac{\lambda}{2\sin\frac{\varphi}{2}}.$$

Therefore, to provide at least one interference fringe 31 across the image 30 of a beam from one of the lasers 20 in laser array 10 laser output which is size D of laser output itself, the angle $\phi$ between the beams 14 and 15 in FIG. 5 should be not less than $$\varphi \geq 2\sin^{-1}\frac{\lambda}{2\Lambda} \approx 2\sin^{-1}\frac{\lambda}{2D}$$

and the size of photodetector 21 should be less than ~0.25Λ. Of course, smaller size of photodetector will provide more accurate calculations of phases. Only one photodetector 21 per laser 20 is required for measurements.

Another design of the system for phase measurements is shown in FIG. 4 where the reference laser is separated from the steering beam laser array 10. This design can be more convenient for reference beam positioning and its amplification.

Since the laser array 10 located in the first focus area 1 of the reflector 2 has some finite size, its image in the second focus area 3 may not be an exact copy of laser array outputs in array 10 due to aberrations or distortions. This may result in slightly different apparent positions and sizes of particular laser 20 in array 10 at the image received at focus area 3. These aberrations and/or distortions (for example, in the shape of the reflector 2) should preferably be taken into account by a proper design of photodetector array 16. In other words, all the sizes and positions of beam output images 30 in the area of photodetector array 16 should preferably be calculated or measured and the photodetectors 21 should be preferably positioned in the centers of these images 30.

The reflectors 2 described above have exterior and interior surfaces. If none of them has special coatings, the intensities of beams reflected from these surfaces in the direction of the area of photodetector array 16 are approximately equal to each other. This will result in the additional interference between these beams and deteriorate the accuracy of phase measurements. Therefore, an antireflection coating should preferably be applied to one of these surfaces, preferably to the exterior surface, to decrease the interference between these beams. In addition, the use of antireflection coatings should reduce the propagation losses of transmitted beams using for beam steering. Reflection coatings for partial reflection can also be applied to the interior surfaces to produce a sufficiently strong reflection of the laser array, as needed, for reliable operation. Otherwise, an uncoated interior surface may not produce sufficiently strong reflections for reliable measurements to be obtained by the disclosed apparatus.

In FIGS. 3a and 3b it would appear that if the reflected beams 14 of array 10 are pointed towards mirror 5, that the mirror 5 would screen the beam 12. However, the mirror 5 has to reflect only small part of incident beam having a size large enough for illumination of the area of laser output images 16, which area is rather small. Therefore, depending on the particular design of laser array 10 and required angle of steering, the reflector for phase measurement, the position of reference beam, and the size and position of mirror 5 can be selected to optimize the design.

The paraboloidal reflector 2 of FIG. 3b can handle the angles from normal to the laser array surface to the direction pointing to the boundary between two paraboloids, while the ellipsoidal reflector 2 of FIG. 3a can handle a wider diverging beam (subject to the size and position of mirror 5 which might interfere). The partially reflecting ellipsoidal reflector or dual paraboloidal reflector 2 can provide protection for the beam steering laser array 10 from environmental impacts or damage.

This concludes the description of the preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for collecting optical information for measurement of individual phases of beams from a laser array, the method comprising:
    placing the laser array at a first area of a partially reflecting ellipsoidal or dual paraboloidal reflector to thereby image the laser array at a second area of the partially reflecting ellipsoidal or dual paraboloidal reflector;
    illuminating the image of the laser array at the second area with a phase modulated beam from another laser coherent with the laser array;
    disposing a photodetector array ordered in accordance with the image of the laser array outputs at the second area; and
    detecting the signals from the photodetector array and determining phase differences between beams from the laser array and from the reference beam.

2. The method of claim 1 wherein the photodetector array is ordered in accordance with the image of the laser array at the second area taking account for shape distortions and/or aberrations in the partially reflecting ellipsoidal or dual paraboloidal reflector.

3. The method of claim 1 wherein partially reflecting ellipsoidal or dual paraboloidal reflector has an antireflection coating disposed thereon.

4. The method of claim 1 wherein the another laser coherent with the laser array is a reference laser modulated with a sinusoidal phase dither.

5. The method of claim 4 wherein the reference laser is disposed in said laser array with a plurality of non-reference lasers.

6. The method of claim 5 wherein the phase modulated beam from the reference laser illuminates the image of the laser array at the second area and produces an interference pattern with at least one interference fringe corresponding to each non-reference laser in the laser array.

7. The method of claim 1 wherein at least most of the lasers in the laser array produce images thereof at the second area, the images thereof having a diameter D which is related to an angle of incidence φ between the beam from the laser in the laser array and the phase modulated beam from the another laser coherent with the laser array by the formula $$\varphi \geq 2\sin^{-1}\frac{\lambda}{2\Lambda} \approx 2\sin^{-1}\frac{\lambda}{2D}$$

where λ is the wavelength of the another laser coherent with the laser array and where Λ is the period of fringes developed by interference of the beam from the laser in the laser array and the beam from the another laser coherent with the laser array.

8. The method of claim 7 wherein photodetector array has a number of photodetectors equal to a number of lasers in said laser array, but not including the another laser coherent with the laser array in said last mentioned number.

9. The method of claim 8 wherein each photodetector in said photodetector array has a diameter less than ~0.25Λ.

10. An apparatus for measurement of individual phases of beams from a beam steering laser array relative to a reference laser beam, the apparatus comprising:
    a partially reflecting ellipsoidal reflector or partially reflecting dual paraboloidal reflector having two focal areas, wherein the beam steering laser array is located at one of the two focal areas and wherein a reflected image of the beam steering laser array occurs at the other one of the two focal areas;
    a reference laser for generating said reference beam as a phase modulated beam coherent with the laser array and for interfering with beams from the beam steering laser array after reflection from said partially reflecting ellipsoidal reflector or partially reflecting dual paraboloidal reflector; and
    an array of photodetectors responsive to one or more fringe patterns caused by the phase modulated beam interfering with beams from the beam steering laser array after reflection from said partially reflecting ellipsoidal reflector or partially reflecting dual paraboloidal reflector.

11. The apparatus of claim 10 wherein the array of photodetectors is ordered in accordance with an image of the beam steering laser array at the other one of the two focal areas taking account for shape distortions and/or aberrations in the partially reflecting ellipsoidal or dual paraboloidal reflector.

12. The apparatus of claim 10 wherein partially reflecting ellipsoidal or dual paraboloidal reflector has an antireflection coating disposed thereon.

13. The apparatus of claim 10 wherein the reference laser coherent with the 1 beam steering laser array is modulated with a sinusoidal phase dither.

14. The apparatus of claim 13 wherein the reference laser is disposed in said beam steering laser array with a plurality of non-reference lasers.

15. The apparatus of claim 14 wherein the phase modulated beam from the reference laser illuminates the image of the beam steering laser array at the second focal area and produces an interference pattern with at least one interference fringe corresponding to each non-reference laser in the beam steering laser array.

16. The apparatus of claim 10 wherein at least most of the lasers in the beam steering laser array produce images thereof at the second focal area, the images thereof each having a diameter D which is related to an angle of incidence φ between the beam from the laser in the laser array and the phase modulated beam from the reference laser with the beam steering laser array by the formula $$\varphi \geq 2\sin^{-1}\frac{\lambda}{2\Lambda} \approx 2\sin^{-1}\frac{\lambda}{2D}$$

where $\lambda$ is the wavelength of the reference laser and where where $\Lambda$ is the period of fringes developed by interference of the beam from the laser in the laser array and the beam from the reference laser coherent with the laser array.

17. The apparatus of claim 16 wherein photodetector array has a number of photodetectors equal to a number of lasers in said laser array, but not including the reference laser, if it is disposed with the beam steering laser array, in said last mentioned number.

18. The apparatus of claim 17 wherein each photodetector in said photodetector array has a diameter less than ~0.25$\Lambda$.

\* \* \* \* \*